(12) United States Patent
Song

(10) Patent No.: US 8,218,325 B2
(45) Date of Patent: Jul. 10, 2012

(54) CHASSIS BASE AND PLASMA DISPLAY APPARATUS HAVING THE SAME

(75) Inventor: Yoo-Jin Song, Suwon-si (KR)

(73) Assignee: Samsung SDI Co., Ltd., Suwon-si, Gyeonggi-do (KR)

(*) Notice: Subject to any disclaimer, the term of this patent is extended or adjusted under 35 U.S.C. 154(b) by 242 days.

(21) Appl. No.: 12/591,920

(22) Filed: Dec. 4, 2009

(65) Prior Publication Data

US 2010/0149765 A1  Jun. 17, 2010

(30) Foreign Application Priority Data

Dec. 12, 2008 (KR) .................. 10-2008-0126377

(51) Int. Cl.
*H05K 5/00* (2006.01)

(52) U.S. Cl. .................. 361/752; 361/807; 361/810

(58) Field of Classification Search .................. 361/749, 361/730, 752, 796, 800, 807, 810, 787, 803; 349/58
See application file for complete search history.

(56) References Cited

U.S. PATENT DOCUMENTS

| | | | | |
|---|---|---|---|---|
| 6,744,186 B2 * | 6/2004 | Oishi et al. | ...................... | 313/46 |
| 7,394,186 B2 * | 7/2008 | Kim | ................................ | 313/46 |
| 7,457,120 B2 * | 11/2008 | Bae et al. | ....................... | 361/704 |
| 7,463,490 B2 * | 12/2008 | Kim et al. | ....................... | 361/752 |
| 7,554,798 B2 * | 6/2009 | Tanokuchi et al. | ...... | 361/679.21 |
| 7,715,202 B2 * | 5/2010 | Morita | ........................... | 361/759 |
| 7,751,203 B2 * | 7/2010 | Moon et al. | ................... | 361/809 |
| 7,872,877 B2 * | 1/2011 | Urano et al. | .................. | 361/810 |
| 7,944,683 B2 * | 5/2011 | Sato | ........................ | 361/679.21 |

FOREIGN PATENT DOCUMENTS

| | | |
|---|---|---|
| KR | 10-2004-0035360 A | 4/2004 |
| KR | 10-2006-0008718 A | 1/2006 |
| KR | 10-2006-0063500 A | 6/2006 |
| KR | 10 2007-0106230 A | 11/2007 |

OTHER PUBLICATIONS

Korean Office Action in KR 10-2008-0126377, dated Nov. 29, 2010 (Song, et al.).

* cited by examiner

*Primary Examiner* — Hung S Bui

(74) *Attorney, Agent, or Firm* — Lee & Morse, P.C.

(57) ABSTRACT

A plasma display apparatus includes a plasma display panel (PDP), a chassis base secured on a first side to the PDP and having a driving circuit board mounted on a second side, a tower-shaped fixing unit that protrudes above the second side of the chassis base, and a back cover secured to a tower unit of the tower-shaped fixing unit to cover the driving circuit board.

18 Claims, 4 Drawing Sheets

CHASSIS BASE AND PLASMA DISPLAY APPARATUS HAVING THE SAME

BACKGROUND

1. Field

Embodiments relate to a chassis base and a plasma display apparatus having the same.

2. Description of the Related Art

A plasma display apparatus displays an image on a plasma display panel (PDP) using plasma generated by discharging gases. The plasma display apparatus includes a PDP, a chassis base for supporting the PDP, and a driving circuit board mounted on the chassis base to face the PDP with the chassis base interposed.

The driving circuit board includes a flexible printed circuit (FPC) and a connector. The driving circuit board is coupled to display electrodes or address electrodes provided in the PDP. A driver integrated circuit (IC) that generates signals to be supplied to the display electrodes or the address electrodes is coupled to the driving circuit board. The driver IC is a heat emitting element. Therefore, a heat emitting plate or a heat emitting pipe for emitting heat is coupled to the driver IC.

The heat emitting plate or the heat emitting pipe coupled to the driver IC has a large volume. Therefore, there is a limit to sliming down a conventional plasma display device. Furthermore, even though the height of the heat emitting plate or the heat emitting pipe can be reduced, there is a limit to reducing the entire thickness of the plasma display apparatus, since the driver IC is required to have a certain height to guarantee the air flow needed for minimum heat emission transition.

In addition, in most conventional plasma display apparatuses, a back cover bracket is used to fix a back cover that covers the driving circuit board on the back surface side of the chassis base to the back surface of the chassis base. The shape of the back cover bracket, however, varies with the shape or structure of final product of each set of apparatuses. Therefore, a manufacturing company that provides plasma display modules to be used in a variety of apparatuses must change the structure of the chassis base and the structure of the plasma display module in accordance with the shape of the back cover bracket.

SUMMARY

It is therefore a feature of an embodiment to provide a chassis base and plasma display apparatus having the same, which substantially overcome one or more of the disadvantages of the related art.

It is therefore another feature of an embodiment to provide a chassis base that may effectively emit the heat generated by the heat emitting element of the driving circuit board of the plasma display apparatus.

It is yet another feature of an embodiment to provide a chassis base wherein the heat emitting structure and the back cover bracket structure may be simultaneously designed with the chassis base, so it may be possible to easily change the structure of the plasma display apparatus at a user request.

It is still another feature of an embodiment to provide a chassis base and a plasma display apparatus having the same, which improves the degree of freedom in designing the slim module since it is possible to determine the distance between the PDP or the driving circuit board and the back cover in designing the slim module.

It is therefore another feature of an embodiment to provide a plasma display apparatus that adopts the above-described general-purpose chassis base structure to improve a degree of freedom in assembling the plasma display apparatus and to enable manufacturing of a slim plasma display apparatus.

At least one of the above and other features and advantages may be realized by providing a plasma display apparatus, including a PDP, a chassis base secured on a first side to the PDP and having a driving circuit board mounted on a second side, a tower-shaped fixing unit that protrudes above the second side of the chassis base and a back cover secured to a tower unit of the tower-shaped fixing unit to cover the driving circuit board.

The tower-shaped fixing unit may be a plateau integrated with the chassis base.

The tower-shaped fixing unit may be separated from and secured to the chassis base.

The plasma display apparatus may further include a fixing member to fix the tower-shaped fixing unit to the chassis base.

The chassis base may include a coupling unit into which a part of the tower-shaped fixing unit is inserted.

The plasma display apparatus may further include a supplementary plate provided between the tower-shaped fixing unit and the heat emitting element.

The plasma display apparatus may further include a heat emitting member provided between the tower-shaped fixing unit and the back cover.

The tower-shaped fixing unit may include a step unit on which a heat emitting element coupled to the driving circuit board may be mounted.

The plasma display apparatus may further include a supplementary tower-shaped fixing unit that may be spaced from the tower-shaped fixing unit that protrudes above the second side of the chassis base and to which the back cover is fastened.

The tower-shaped fixing unit may have a structure in which a plurality of protrusions independently may protrude above one surface of the chassis base.

The tower-shaped fixing unit may be in the form of a comb having a smaller length than the length of the PDP in one direction and coupled to the back cover at a plurality of points.

The heat emitting element may be a driver IC that may generate pulses to be selectively applied to electrodes of the PDP.

The plasma display apparatus may further include a tape carrier package (TCP) including the driver IC and coupled to the driving circuit board.

The plasma display apparatus may further include a flexible printed circuit (FPC) to couple terminals of electrodes of the PDP to the TCP.

At least one of the above and other features and advantages may also be realized by providing a chassis base having a first side of which a PDP may be secured and having a second side of which a driving circuit board may be mounted, the chassis base may include a plate-shaped body and a tower-shaped fixing unit that protrudes above the second side, wherein a back cover that covers the driving circuit board may be secured to a tower unit of the tower-shaped fixing unit.

The tower-shaped fixing unit may be a plateau integrated with the plate-shaped body.

The tower-shaped fixing unit may be separated from and secured to the plate-shaped body.

The tower-shaped fixing unit may include a step unit on which a heat emitting element coupled to the driving circuit board is mounted.

The tower-shaped fixing unit may have a structure in which a plurality of protrusions may independently protrude above the second surface of the plate-shaped body.

The tower-shaped fixing unit may be in the form of a comb having a smaller length than a length of the PDP in one direction, the comb to be coupled to the back cover at a plurality of points.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
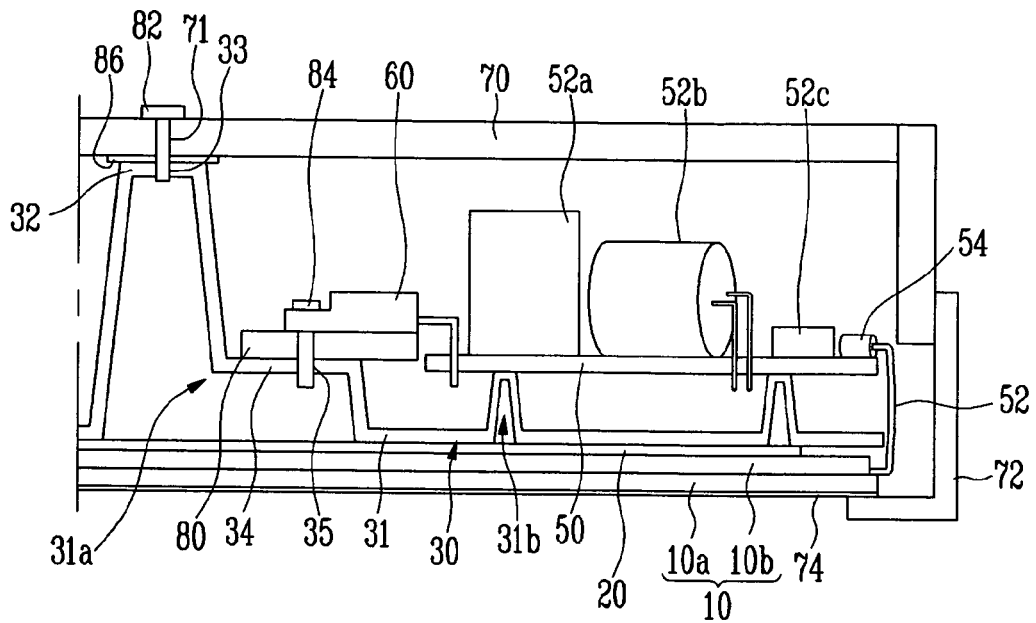
FIG. 1 illustrates a schematic sectional view of a plasma display apparatus according to an embodiment.

Korean Patent Application No. 10-2008-0126377, filed on Dec. 12, 2008, in the Korean Intellectual Property Office, and entitled: "Chassis Base and Plasma Display Apparatus Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Also, when an element is referred to as being "connected to" another element, it can be directly connected to another element or be indirectly connected to another element with one or more intervening elements interposed therebetween. Hereinafter, like reference numerals refer to like elements.

FIG. 1 illustrates a schematic sectional view of a plasma display apparatus according to an embodiment.

Referring to FIG. 1, the plasma display apparatus according to the present embodiment may include a PDP 10 (hereinafter, referred to as a panel), a chassis base 30, a driving circuit board 50, a heat emitting element 60, and a back cover 70. The panel 10 may be attached to a first side of the chassis base 30. The driving circuit board 50 may be mounted on a second side of the chassis base 30.

The panel 10 may include an upper substrate 10a on which a plurality of scan electrodes is formed and a lower substrate 10b including a plurality of address electrodes formed to intersect the scan electrodes. A phosphor layer may be provided on the upper substrate 10a. The phosphor layer may generate visible light by discharge between the scan electrodes, and the address electrodes and may control the transmittance of the generated visible light to display a predetermined image.

The driving circuit board 50 coupled to the scan electrodes and the address electrodes may supply scan signals and data signals. The driving circuit board 50 including various drivers may be coupled to the panel 10 by a flexible printed circuit 52. The drivers may include the heat emitting element 60 and various electric circuits and electric elements 52a, 52b, and 52c. The driving circuit board 50 may include a printed circuit board (PCB). The heat emitting element 60 may include driver integrated circuits (IC) and switching elements included in the drivers for driving the panel 10. The driver ICs may include a scan driver IC and a data driver IC. The switching elements may include a transistor element, e.g., a field effect transistor (FET).

The driver ICs may be provided between the driving circuit board 50 and the panel 10, and may supply driving signals to the panel 10 in response to control signals supplied from the driving circuit board 50. The FPC 52 may be coupled to the driving circuit board 50 by a connector 54 and may be coupled to the driver ICs through the wiring lines (not shown) of the driving circuit board 50. That is, one side of the FPC 52 may be coupled to the terminal of a scan or data driver IC chip and the other side of the FPC 52 may be coupled to a pad which is coupled to the driving electrodes of the panel 10. At this time, to effectively reduce the mounting area of the driver ICs, the FPC 52 may be bent to surround the side surface of the chassis base 30 while being coupled to the driving circuit board 50 provided on one surface, e.g., the second side, of the chassis base 30.

Alternatively, the driver ICs may include packages in a chip on film (COF) method, a chip on glass (COG) method, and a tape carrier package (TCP) method that are directly coupled to the panel 10, so the region including the coupling part may be encapsulated by resin. In this case, the heat emitting element 60 may include the TCP including the driver IC.

The chassis base 30 may include a plate-shaped body 31, a tower-shaped fixing unit 31a, and a coupling unit 31b. The plate-shaped body 31 may be made of a rigid and highly conductive material that can support the panel 10 and the driving circuit board 50. A heat emitting plate 20 may be provided between the panel 10 and the chassis base 30.

The heat emitting plate 20 may emit heat generated when the panel 10 is driven, or may transmit heat to the chassis base 30. When the heat emitting plate 20 is pliable, e.g., a gel, the heat emitting plate 20 may operate as a buffering medium that protects the panel 10 from external shock.

The chassis base 30 may be formed a single body. For example, the tower shaped fixing unit 31a may be integrated with surface of the plate-shaped body 31 to protrude to a predetermined height and in a predetermined shape when the plate-shaped body 31 is molded to manufacture the chassis base 30 by a press method or by an injection method. The tower-shaped fixing unit 31a may include a tower unit 32 that is close to the back cover 70 and to which the back cover 70 is fastened. A first fastening hole 33 may be provided on the tower unit 32 to fix the back cover 70 to the tower-shaped fixing unit 31a by a first fixing member 82, e.g., a screw, a bolt, a boss, etc. so design of an additional back cover bracket may be omitted. The tower-shaped fixing unit 31a according to the present embodiment may replace the back cover bracket. Other alternative mechanisms for securing the back cover 70 to the tower unit 32, e.g., a protrusion inserted into and coupled to the hole of the back cover 70, instead of the first fastening hole, may be provided on the tower unit 32.

In addition, the tower-shaped fixing unit 31a according to the present embodiment may include a step unit 34. The step unit 34 may be provided to mount the heat emitting element 60. To fix the heat emitting element 60 to the step unit 34, a second fastening hole 35 to which a second fixing member 84 is fastened may be provided in the step unit 34. According to the present embodiment, when the chassis base 30 is made of a highly conductive material, the tower-shaped fixing unit 31a may transmit the heat of the heat emitting element 60 mounted on the step unit 34 to the back cover 70 and, thus, may effectively emit the heat of the heat emitting element 60 through the back cover 70.

In the tower-shaped fixing unit 31a according to the present embodiment, a supplementary plate 80 may be provided between the step unit 34 of the tower-shaped fixing unit 31a and the heat emitting element 60 to form a more effective heat emitting structure. Furthermore, a heat emitting member 86 may be provided between the tower unit 32 of the tower-shaped fixing unit 31a and the back cover 70. The heat emitting member 86 may be provided to improve heat transmission efficiency between the tower-shaped fixing unit 31a and the back cover 70. The supplementary plate 80 and the heat emitting member 86 may be made of a highly conductive material, e.g., a heat conductive sheet and conductive plastic. On the other hand, the heat emitting member 86 may include thermal grease that may be coated between the tower-shaped fixing unit 31a and the back cover 70 when the back cover 70 is fastened to the tower-shaped fixing unit 31a.

The coupling unit 31b may be in the form of a plateau integrated with the plate-shaped body 31 when the plate-shaped body 31 is molded and may be secured to the driving circuit board 50. The coupling unit 31b may ensure that the driving circuit board 50 is provided on one surface of the plate-shaped body 31 at a predetermined height. By the above-described coupling unit 31b, the heat generated by the panel 10 to be transmitted to the chassis base 30 through the heat emitting plate 20 may be effectively emitted through the exposed surface of the chassis base 30.

The back cover 70 together with a case 72 may protect the plasma display module against external shock and contaminations. In addition, the back cover 70 and the case 72 may include a plurality of ventilating holes for emitting the heat generated by the panel 10 and the heat emitting element 60 to the outside. The case 72 may be provided on the front surface of the panel 10 to protect the panel 10. The back cover 70 may be fastened to the tower-shaped fixing unit 31a of the chassis base 30 from the back of the module. According to the present embodiment, the back cover 70 may be fastened to the tower-shaped fixing unit 31a that functions as the back cover bracket and may emit the heat conducted from the tower-shaped fixing unit 31a to the outside. The back cover 70 may be preferably made of a highly conductive material.

An optical filter 74 may be provided on one surface of the panel 10. The optical filter 74 may include a glass filter or a film filter.

When the above-described chassis base 30 is used, a back cover bracket having a structure and shape that varies with each specific apparatus may be omitted. In addition, it may be possible to guarantee the heat emission design. Also, by not including the back cover bracket, design of a single set for use with different apparatus may be facilitated. Thus, slim modules may be easily manufactured, since the design of the back cover bracket and the heat emission may be included in the design of the chassis base of the module.

Figure 2:
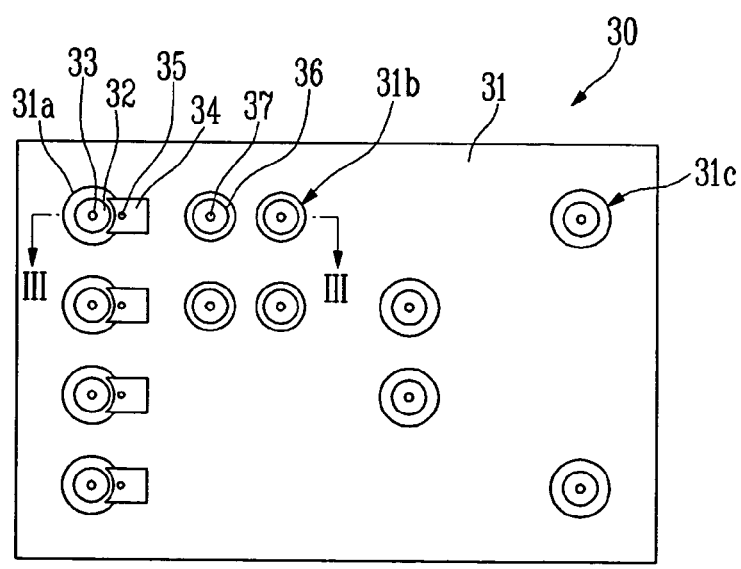
FIG. 2 illustrates a plan view of a chassis base according to the embodiment.
Figure 3:
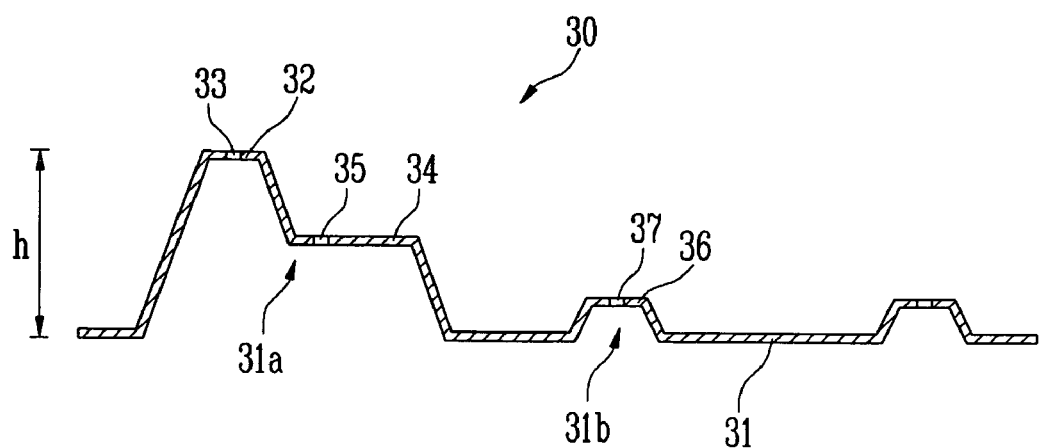
FIG. 3 illustrates a sectional view taken along the line III-III of FIG. 2.

FIG. 2 illustrates a plan view of a chassis base according to the embodiment. FIG. 3 illustrates a sectional view taken along the line III-III of FIG. 2.

Referring to FIGS. 2 and 3, the chassis base 30 according to the present embodiment may correspond to the chassis base adopted by the plasma display apparatus of FIG. 1. The chassis base 30 may include the plate-shaped body 31 and a plurality of plateaus (will be described later) that extend above one side of the plate-shaped body 31. According to the present embodiment, the plateau may have a structure in which a plurality of protrusions that protrudes above a surface of the plate-shaped body 31 is independently formed at predetermined intervals.

The plate-shaped body 31 may function as a heat conductive medium and a heat dispersing member for the panel 10. The chassis base 30 that has the plate-shaped body 31 as a main member may reduce a difference in temperature on the plane of the panel 10 and may disperse heat transmitted from the panel to outside, reducing the temperature of the panel 10. In particular, the chassis base 30 according to the present embodiment may transmit heat generated by the panel 10 and heat generated by the heat emitting elements 60 of the drivers to the back cover 70 by the tower-shaped fixing unit 31a integrated with the plate-shaped body 31 to effectively emit heat. When the coupling units 31b are properly provided in the plate-shaped body 31, deformation of the plate-shaped body 31 may be reduced or prevented. A reinforcing member (not shown) for preventing the plate-shaped body 31 from being deformed may be additionally provided.

The plateau of the plate-shaped body 31 may include the tower unit 32, to which the back cover 70 is fastened, the step unit 34, on which the heat emitting element 60 may be mounted, and a hill unit 36 on which the driving circuit board may be mounted. The tower unit 32 and the step unit 34 may form the tower-shaped fixing unit 31a according to the present embodiment and may be integrated with the chassis base 30 to perform the function of the back cover bracket and the heat emitting function of transmitting the heat of the heat emitting element 60 to the back cover 70. The first fastening hole 33 to which the back cover 70 is fastened may be provided on the tower unit 32 and the second fastening hole 35 for mounting the heat emitting element 60 may be provided in the step unit 34. The hill unit 36 may form the coupling unit 31b and may include a third fastening hole 37 to which the driving circuit board 50 is fastened. Another such coupling unit 31b may be provided to secure another end of the driving circuit board 50, as illustrated, or the coupling unit 31b may be centered with respect to the driving circuit board 50.

In addition, the plate-shaped body 31 may include a supplementary tower-shaped fixing unit 31c (see FIG. 2). The supplementary tower-shaped fixing unit 31c may be integrated with the plate-shaped body 31 and may have the same structure and function as the tower-shaped fixing unit 31a according to the present embodiment, except that the step unit on which the heat emitting element 60 is mounted may not be provided. That is, the supplementary tower-shaped fixing unit 31c may include a fastening hole to which the back cover 70 is fastened and may transmit the heat generated by the panel 10 to the back cover 70.

In addition, the chassis base 30 according to the present embodiment may reduce the thickness of the plasma display module by use of the tower-shaped fixing unit 31a. The height h, i.e., from the plate-shaped body 31 to the first fastening hole 33 of the chassis base 30 according to the present embodiment, may be about 25 mm.

In particular, only the tower-shaped fixing unit 31a extends above the surface of the plate-shaped body 31 higher than other elements of the display, e.g., electronic elements 52a, 52b, and 52c. Thus, the height of the tower-shaped fixing unit 31a may determine an overall thickness of the display. Considering that the height of the conventional plasma display apparatus from the chassis base to the back cover is about 80 mm, the thickness of the plasma display apparatus may be significantly reduced when the chassis base 30 according to the present embodiment is used.

Figure 4:
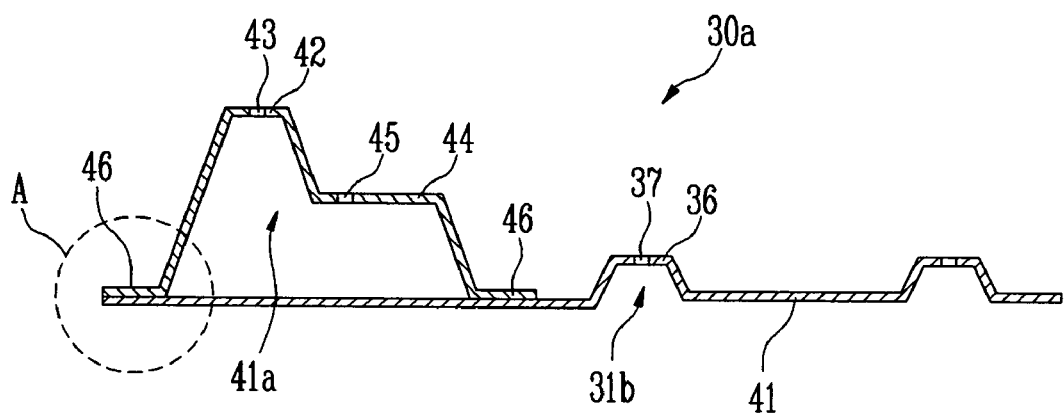
FIG. 4 illustrates a sectional view of a chassis base according to another embodiment.
Figure 5A:
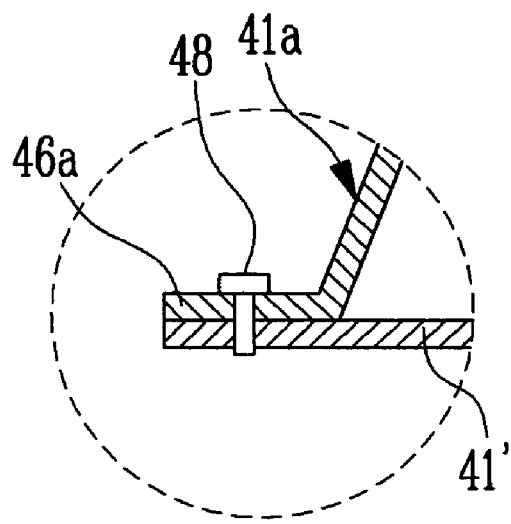
FIGS. 5A and 5B illustrate partial sectional views of another coupling structure of the chassis base of FIG. 4.
Figure 5B:
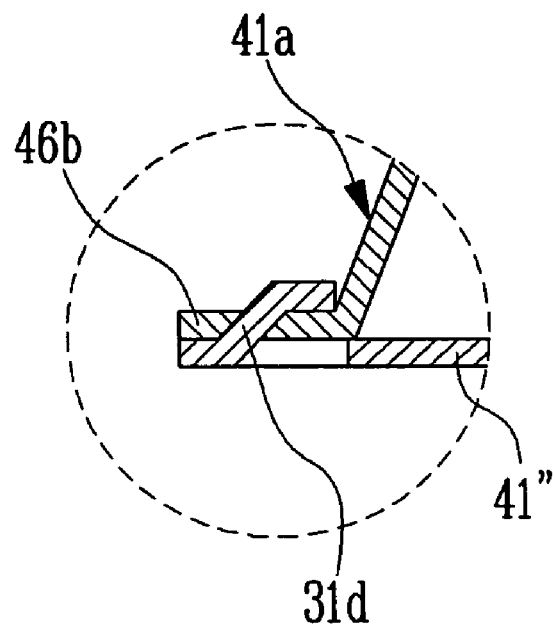

FIG. 4 illustrates a sectional view of the chassis base according to another embodiment. FIGS. 5A and 5B illustrate partial sectional views of another coupling structure of the chassis base of FIG. 4. The sectional views of FIGS. 5A and 5B correspond to part A of FIG. 4.

Referring to FIG. 4, a chassis base 30a according to the present embodiment may be adopted as the chassis base of the plasma display apparatus of FIG. 1. The chassis base 30a may include a plate-shaped body 41, the hill unit 36 that protrudes above one side of the plate-shaped body 41, and a tower-shaped fixing unit 41a coupled to one side of the plate-shaped body 41.

The tower-shaped fixing unit 41a may be formed as an additional member, separate from the plate-shaped body 41 so that a tower unit 42 to which the back cover 70 is fastened and a step unit 44 on which the heat emitting element 60 is mounted may be provided. The tower-shaped fixing unit 41a may be integrated with the plate-shaped body 41 to perform the function of the back cover bracket of the chassis base 30a and the function of the heat conductive medium for transmitting the heat of the heat emitting element 60 to the back cover 70. A first fastening hole 43, to which the back cover 70 is fastened, may be provided on the tower unit 42. A second fastening hole 45 for mounting the heat emitting element 60 may be provided in the step unit 44. A flange unit 46 may be formed on one side of the tower-shaped fixing unit 41a and may fix the tower-shaped fixing unit 41a to the plate-shaped body 41.

To fix the tower-shaped fixing unit 41a to the plate-shaped body 41, the flange unit 46 may be, e.g., welded to the plate-shaped body 41 by a laser or may be attached to the plate-shaped body 41 by an adhesive, as illustrated in FIG. 4. Alternatively, as illustrated in FIG. 5A, a flange unit 46a may be fixedly coupled to the plate-shaped body 41' using an additional fixing member 48, e.g., a screw, a bolt, a boss, etc. As a further alternative, as illustrated in FIG. 5B, a flange unit 46b may be inserted into and coupled to a coupling unit 31d provided in a plate-shaped body 41". The coupling structure between the tower-shaped fixing unit 41a and the plate-shaped bodies 41, 41', and 41" may vary as long as the function of the heat conductive medium can be effectively performed while stably supporting the back cover 70.

Figure 6:
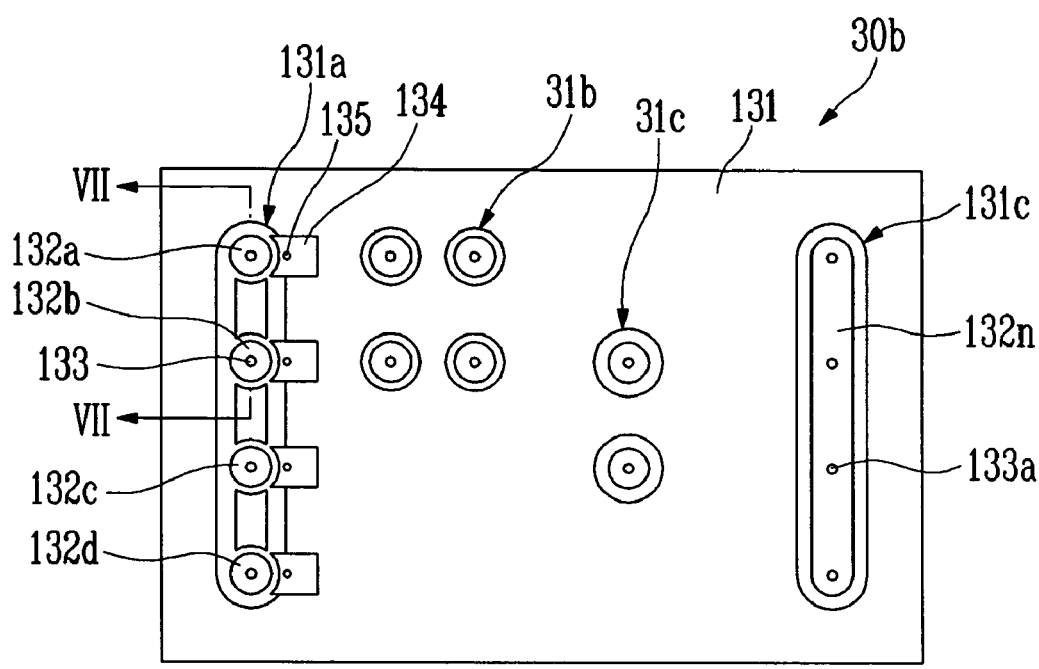
FIG. 6 illustrates a plan view of a chassis base according to still another embodiment.
Figure 7:
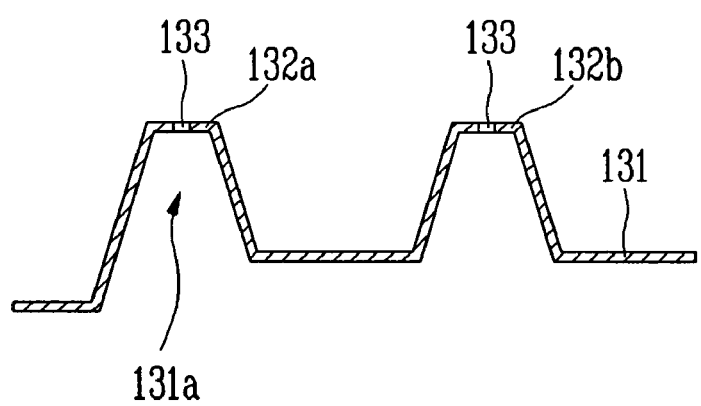
FIG. 7 illustrates a sectional view taken along the line VII-VII of FIG. 6.

FIG. 6 illustrates a plan view of a chassis base according to still another embodiment. FIG. 7 illustrates a sectional view taken along the line VII-VII of FIG. 6.

Referring to FIGS. 6 and 7, a chassis base 30b according to the present embodiment may be adopted by the plasma display apparatus of FIG. 1 as the chassis base. The chassis base 30b may include a plate-shaped body 131 and a plurality of plateau that extend above one side of the plate-shaped body 131. According to the present embodiment, the plateaus may include a tower-shaped fixing unit 131a, the coupling unit 31b, the first supplementary tower-shaped fixing unit 31c, and a second supplementary tower-shaped fixing unit 131c.

The tower-shaped fixing unit 131a may be in the form of a comb having a smaller length than the length of the plate-shaped body 131 in one direction and may be coupled to the back cover at a plurality of points. The tower-shaped fixing unit 131a may include a plurality of tower units 132a, 132b, 132c, and 132d, and step units 134 adjacent to the tower units 132a, 132b, 132c, and 132d. A first fastening hole 133 to which the back cover 70 is fastened may be provided on each of the tower units 132a, 132b, 132c, and 132d. A second fastening hole 135 to which the heat emitting element 60 is fixed may be provided on each of the step units 134.

Since description of the coupling unit 31b and the first supplementary tower-shaped fixing unit 31c is the same as description of the corresponding elements of the above-described embodiment, description thereof will be omitted.

The second supplementary tower-shaped fixing unit 131c may have the same function as the tower-shaped fixing unit 131a according to the present embodiment, except that the step units 134, on which the heat emitting element 60 is mounted are not provided. A plurality of third fastening holes 133a may be provided in the tower unit 132n of the second supplementary tower-shaped fixing unit 131c. The back cover may be fastened to the third fastening holes 133a.

The tower-shaped fixing unit 131a and the second supplementary tower-shaped fixing unit 131c according to the present embodiment may be integrated with the plate-shaped body 131 or may be made as an additional member to be attached to the plate-shaped body 131.

The chassis base structure according to the above-described embodiments may be applied to the entire plasma display module or applied as a part of the plasma display module. In particular, since only the fastening unit for the back cover may protrude from the chassis base above other elements of the display, it may be possible to minimize the manufacturing cost of the entire structure. In addition, since the distance between the circuit and the back cover is uniformly maintained in the module, the module may be uniformly designed to have at least a minimum height that any set of apparatus requires, thereby reducing the manufacturing cost.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display apparatus, comprising:
   a plasma display panel;
   a chassis base secured on a first side to the plasma display panel and having a driving circuit board mounted on a second side;
   a tower-shaped fixing unit that protrudes above the second side of the chassis base, the tower-shaped fixing unit including a step unit on which a heat emitting element coupled to the driving circuit board is mounted; and
   a back cover secured to a tower unit of the tower-shaped fixing unit to cover the driving circuit board.

2. The plasma display apparatus as claimed in claim 1, wherein the tower-shaped fixing unit is a plateau integrated with the chassis base.

3. The plasma display apparatus as claimed in claim 1, wherein the tower-shaped fixing unit is separated from and secured to the chassis base.

4. The plasma display apparatus as claimed in claim 3, further comprising a fixing member to fix the tower-shaped fixing unit to the chassis base.

5. The plasma display apparatus as claimed in claim 3, wherein the chassis base includes a coupling unit into which a part of the tower-shaped fixing unit is inserted.

6. The plasma display apparatus as claimed in claim 1, further comprising a supplementary plate provided between the tower-shaped fixing unit and the heat emitting element.

7. The plasma display apparatus as claimed in claim 1, further comprising a heat emitting member provided between the tower-shaped fixing unit and the back cover.

8. The plasma display apparatus as claimed in claim 1, further comprising a supplementary tower-shaped fixing unit spaced from the tower-shaped fixing unit, that protrudes above the second side of the chassis base and to which the back cover is fastened.

9. The plasma display apparatus as claimed in claim 1, wherein the tower-shaped fixing unit has a structure in which a plurality of protrusions independently protrudes above one surface of the chassis base.

10. The plasma display apparatus as claimed in claim 1, wherein the tower-shaped fixing unit is in the form of a comb having a smaller length than the length of the plasma display panel in one direction and coupled to the back cover at a plurality of points.

11. A plasma display apparatus comprising:
a plasma display panel;
a chassis base secured on a first side to the plasma display panel and having a driving circuit board mounted on a second side;
a tower-shaped fixing unit that protrudes above the second side of the chassis base; and
a back cover secured to a tower unit of the tower-shaped fixing unit to cover the driving circuit board,
wherein the heat emitting element is a driver IC that generates pulses to be selectively applied to electrodes of the plasma display panel.

12. The plasma display apparatus as claimed in claim 11, further comprising a tape carrier package including the driver IC and coupled to the driving circuit board.

13. The plasma display apparatus as claimed in claim 12, further comprising a flexible printed circuit (FPC) to couple terminals of electrodes of the plasma display panel to the tape carrier package.

14. A chassis base having a first side of which a plasma display panel is secured and having a second side of which a driving circuit board is mounted, the chassis base comprising:
a plate-shaped body; and
a tower-shaped fixing unit that protrudes above the second side, the tower-shaped fixing unit including a step unit on which a heat emitting element coupled to the driving circuit board is mounted;
wherein a back cover that covers the driving circuit board is secured to a tower unit of the tower-shaped fixing unit.

15. The chassis base as claimed in claim 14, wherein the tower-shaped fixing unit is a plateau integrated with the plate-shaped body.

16. The chassis base as claimed in claim 14, wherein the tower-shaped fixing unit is separated from and secured to the plate-shaped body.

17. The chassis base as claimed in claim 14, wherein the tower-shaped fixing unit has a structure in which a plurality of protrusions independently protrude above the second surface of the plate-shaped body.

18. The chassis base as claimed in claim 14, wherein the tower-shaped fixing unit is in the form of a comb having a smaller length than a length of the plasma display panel in one direction, the comb to be coupled to the back cover at a plurality of points.

* * * * *